(12) United States Patent
Hellebrand et al.

(10) Patent No.: US 7,768,289 B2
(45) Date of Patent: Aug. 3, 2010

(54) TESTING METHOD AND TESTING DEVICE FOR AN INTEGRATED CIRCUIT

(75) Inventors: Andreas Hellebrand, Moessingen (DE); Karl-Wilhelm Hoesch, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/821,291

(22) Filed: Jun. 21, 2007

(65) Prior Publication Data

US 2008/0007269 A1    Jan. 10, 2008

(30) Foreign Application Priority Data

Jun. 21, 2006   (DE) .................. 10 2006 028 414

(51) Int. Cl.
   *G01R 31/26* (2006.01)
(52) U.S. Cl. ...................... 324/765; 438/14
(58) Field of Classification Search ......... 324/754–765; 327/565; 716/4; 702/117; 438/14–18
   See application file for complete search history.

(56) References Cited

U.S. PATENT DOCUMENTS 4,633,192 A * 12/1986 Anami ................ 330/277
5,594,349 A * 1/1997 Kimura ................ 324/551
5,986,461 A * 11/1999 Kalb, Jr. ............... 324/765
6,087,895 A * 7/2000 Ono .................... 327/565
6,184,048 B1 * 2/2001 Ramon ................. 438/14
6,188,234 B1 * 2/2001 Abadeer et al. ........ 324/766
6,359,490 B1 * 3/2002 Oyamada .............. 327/313
6,756,806 B1 * 6/2004 Yang et al. ............ 324/769
6,927,078 B2 * 8/2005 Saijyo et al. ........... 438/10
2001/0013790 A1 * 8/2001 Kusumoto ............. 324/765

* cited by examiner

*Primary Examiner*—Ha Tran T Nguyen
*Assistant Examiner*—Arleen M Vazquez
(74) *Attorney, Agent, or Firm*—Kenyon & Kenyon LLP

(57) ABSTRACT

A testing method for an integrated circuit which has at least one ground terminal and multiple signal terminals, a signal potential being applied to a signal terminal and a ground potential being applied to the at least one ground terminal. A floating potential is applied to each further signal terminal. The testing method is suitable to detect more defects than a standard testing method of the Automotive Electronics Council.

5 Claims, 1 Drawing Sheet

TESTING METHOD AND TESTING DEVICE FOR AN INTEGRATED CIRCUIT

BACKGROUND INFORMATION

In a testing method, which is recognized by the Automotive Electronics Council as the standard in quality assurance, for an integrated circuit which has at least one ground terminal and multiple signal terminals a signal potential is applied to one signal terminal and a ground potential (grounding) is applied to the at least one ground terminal. A ground potential is applied to all other signal terminals. Signal terminal in this connection means each terminal which is not intended to be connected to ground during operation of the circuit.

A disadvantage of this testing method is that the resulting characteristic curve is barely dependent on the structure of the integrated circuit. It has been found in experiments that this testing method is therefore unsuitable for detecting certain crystal defects and aluminum spiking. Therefore, it may be the case that certain defective integrated circuits enter the market, which represents a safety risk in particular in safety-relevant vehicle electronics.

SUMMARY OF THE INVENTION

An object of the present invention is to provide a testing method for an integrated circuit which is suitable for detecting further defects and a corresponding testing device.

The present invention relates to a testing method in which a floating potential is applied to each further signal terminal.

The testing method according to the present invention advantageously exhibits increased stability and, compared with the related art, greater independence from hardware-related loads. Moreover, the testing method is more independent from chip-internal states (e.g., charged circuit nodes) and external effects.

In a specific embodiment, a single value of the signal potential is used for analysis and the single value of the signal potential is determined via simulation prior to the measurement.

This advantageously allows for a simple analysis.

In another specific embodiment, a ground potential is applied to a further ground terminal.

This advantageously makes the measurement even more conclusive.

Furthermore, the present invention relates to a testing device for an integrated circuit which is set up for applying a floating potential to each further signal terminal.

In a preferred specific embodiment, the testing device is set up for applying a ground potential to a further ground terminal.

DETAILED DESCRIPTION

Figure 1:
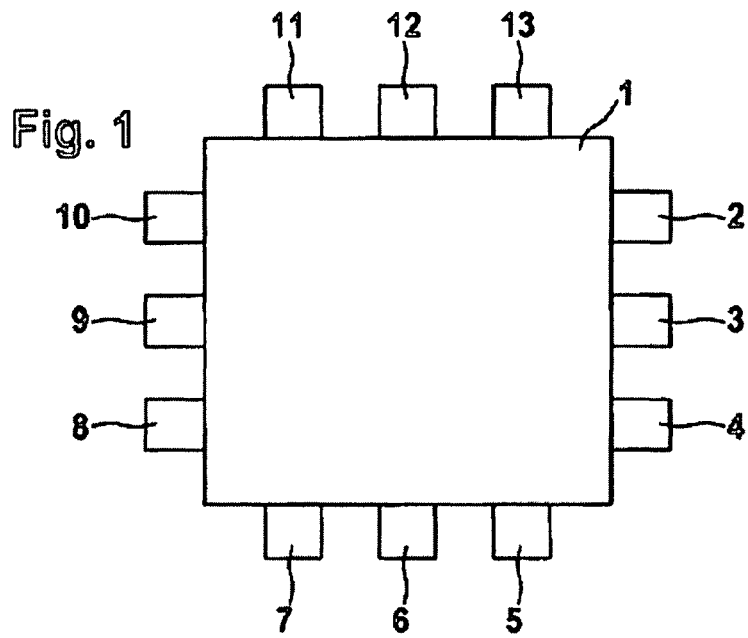
FIG. 1 shows a schematic view of an integrated circuit.

FIG. 1 shows a schematic view of an integrated circuit 1 which is typically an ASIC (application-specific integrated circuit). The integrated circuit has multiple electrical terminals 2 through 13. These terminals are internally connected to components such as diodes, bipolar transistors, field-effect transistors, resistors, and capacitors. Internal connections via integrated components exist between terminals 2 through 13.

For testing the functionality, a ground potential (grounding) is applied to each of ground terminals 2, 3 and another variable potential is applied to signal terminal 4. No potential (floating potential) is applied to further signal terminals 5 through 13. For example, between ground terminals 2 and 3 and signal terminal 4 an internal connection exists via one or multiple integrated components or a pn junction (diode) is formed such as, for example, between the substrate and the source or the drain of a field-effect transistor. For testing the functionality of the integrated circuit, two terminals are preferably used for which a characteristic curve is expected which is essentially determined by a diode.

A measurement of such terminals is particularly defect-sensitive in the cut-off region of the diode in particular. The defect of the integrated circuit results from the deviation of the measured characteristic curve from an expected curve. The defect alternatively also results from the deviation of a measuring point (voltage value and associated current value) from an expected measuring point. The measuring point is predetermined via simulation and is in the expected cut-off region. The testing method may be carried out for the complete test of each of further signal terminals 5 through 13. Supply pins and an existing power reserve (capacity) are finally measured to prevent charging.

Figure 2:
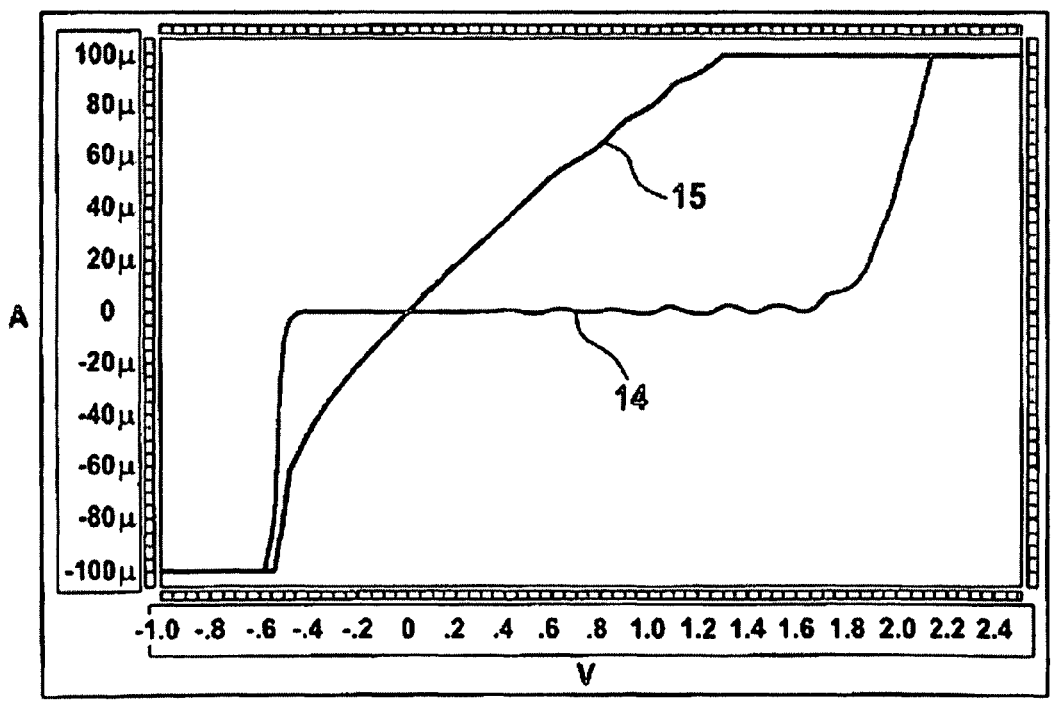
FIG. 2 shows a comparison of the characteristic curves for the standard testing method of the Automotive Electronics Council and for a testing method according to the present invention.

FIG. 2 shows a comparison of a characteristic curve 14 for the standard testing method of the Automotive Electronics Council and a characteristic curve 15 for a testing method according to the present invention. The integrated circuit is defective because both characteristic curves clearly deviate from the expected diode characteristic curve. Characteristic curves 14 and 15 also deviate clearly from one another. A device having as little wiring as possible, e.g., great capacitance, is used for testing. Individual elements of the testing device may be isolated by a relay circuit, for example. As is apparent from FIG. 2, the maximum current may be limited to ±100 µA in order to prevent the integrated circuit from being damaged.

What is claimed is:

1. A testing method for an integrated circuit which has at least one ground terminal and a plurality of signal terminals, the method comprising:
    applying a signal potential to one of the signal terminals;
    applying a ground potential to the at least one ground terminal;
    applying a floating potential to each further signal terminal;
    determining an expected characteristic curve between two of the plurality of signal terminals;
    determining a characteristic curve between the two signal terminals; and
    comparing the characteristic curve to the expected characteristic curve, deviation of the characteristic curve from the expected characteristic curve indicating a defect in the integrated circuit.

2. The testing method according to claim 1, wherein a single value of the signal potential is used for analysis and the single value of the signal potential has been determined via a simulation prior to a measurement.

3. The testing method according to claim 1, further comprising applying a ground potential to a further ground terminal.

4. A testing device for an integrated circuit which has at least one ground terminal and a plurality of signal terminals, comprising: an arrangement applying a signal potential to one of the signal terminals; an arrangement applying a ground potential to the at least one ground terminal; an arrangement applying a floating potential to each further signal terminal; an arrangement determining an expected characteristic curve between two of the plurality of signal terminals; and an arrangement determining a characteristic curve between the two signal terminals, deviation of the characteristic curve from the expected characteristic curve indicating a defect in the integrated circuit.

5. The testing device according to claim 4, further comprising an arrangement applying a ground potential to a further ground terminal.

\* \* \* \* \*